United States Patent [19]

Biefeld et al.

[11] Patent Number: 4,616,241

[45] Date of Patent: Oct. 7, 1986

[54] SUPERLATTICE OPTICAL DEVICE

[75] Inventors: Robert M. Biefeld; Ian J. Fritz; Paul L. Gourley; Gordon C. Osbourn, all of Albuquerque, N. Mex.

[73] Assignee: The United States of America as represented by the United States Department of Energy, Washington, D.C.

[21] Appl. No.: 477,698

[22] Filed: Mar. 22, 1983

[51] Int. Cl.⁴ .................. H01L 33/00; H01S 3/19
[52] U.S. Cl. .......................... 357/16; 357/17; 357/30; 357/61; 372/45
[58] Field of Search .......... 357/16, 17, 30, 61; 372/45, 44; 136/262

[56] References Cited

U.S. PATENT DOCUMENTS 4,319,259  3/1982  Ohsima et al. .................. 357/61
4,365,260  12/1982  Holonyak, Jr. .................. 357/17

OTHER PUBLICATIONS

J. W. Matthews et al., "Defects in Epitaxial Multilayers", *Journal of Crystal Growth* 27 (1974), pp. 118–125.
G. C. Osbourn et al., "A $GaAs_xP_{1-x}$/GaP Strained-Layer Supperlattice", Appl. Phys. Lett. 41(2), Jul. 15, 1982, pp. 172–174.
Osbourn, "Strained-Layer Superlattices from Lattice Mismatched Materials", J. Appl. Phys. 53(3), Mar. 1982, pp. 1586–1589.

*Primary Examiner*—James W. Davie
*Attorney, Agent, or Firm*—George H. Libman; Albert Sopp; Judson R. Hightower

[57] ABSTRACT

A semiconductor optical device which includes a superlattice having direct transitions between conduction band and valence band states with the same wave vector, the superlattice being formed from a plurality of alternating layers of two or more different materials, at least the material with the smallest bandgap being an indirect bandgap material.

9 Claims, 7 Drawing Figures

SUPERLATTICE OPTICAL DEVICE

The U.S. Government has rights in this invention pursuant to contract number DE-AC04-76DP00789 between the Department of Energy and Western Electric Company.

BACKGROUND OF THE INVENTION

The present invention relates generally to an optical device, and more particularly, to an optical device utilizing a superlattice of one or more indirect bandgap materials.

The strengths of optical transitions between conduction band states and valence band states in semiconductors are greatly influenced by whether or not these transitions require phonon participation. Direct transitions (i.e. transitions between states with the same wavevector) can occur without phonon participation, and can have relatively large transition strengths. However, indirect transitions (i.e. transitions between states with unequal wave vectors) require phonon emission or phonon absorption in addition to the photon emmision or absorption process, and have relatively weak transition strengths.

The efficiency of optical devices can be significantly improved by the use of active region materials with direct transitions at the photon energies of interest. In addition, certain optical devices such as laser diodes essentially require the use of materials with direct band-edge transitions; i.e., electron-hole recombination events which occur at energies close to the band gap.

Many materials having direct transitions are used in optical devices. For instance, bulk GaAs and InAs are examples of conventional direct transition materials. However, some applications require the use of materials having indirect bandgaps. For example, all of the known technologically relevant compound semiconductors with appropriate bandgaps for green LEDs and green laser diodes have indirect band gaps. The emission efficiencies of sub-bandgap transitions can be enhanced somewhat in certain materials by the incorporation of selected impurities. However, the efficiencies obtained in this manner do not approach those obtained from direct gap materials.

SUMMARY OF THE INVENTION

It is an object of this invention to provide an optical detector having a direct bandgap material formed from two materials, at least the material with the smallest bandgap being an indirect material.

It is another object of this invention to provide a semiconductor optical emitter utilizing such a superlattice.

It is still another object of the invention to provide efficient green semiconductor optical devices.

Additional objects, advantages and novel features of the invention will become apparent to those skilled in the art by the examination of the following description, or may be learned by practice of the invention. The objects and advantages of the invention may be realized and attained by means of the instrumentalities and combinations particularly pointed out in the appended claims.

To achieve the foregoing and other objects and in accordance with the purpose of the present invention, as embodied and broadly described herein, the optical device of this invention may comprise a superlattice having direct transitions between conduction band and valence band states with the same wave vector, the superlattice being formed from a periodic plurality of alternating layers of two different materials, at least one of the materials having an indirect bandgap, as described above and each of the layers being grown along the direction in which indirect conduction minima lie.

BRIEF DESCRIPTION OF THE DRAWINGS

The accompanying drawings, which are incorporated in and form a part of the specification, illustrate several embodiments of the present invention and, together with the description, serve to explain the principles of the invention.

DETAILED DESCRIPTION OF THE INVENTION

A superlattice is a semiconductor structure formed from a plurality of very thin (i.e., typically less than a few hundred Angstroms) layers of two or more different materials. It has previously been believed that a high quality superlattice must be constructed from lattice-matched materials; i.e., those having a lattice constant difference of less than 0.1%. An example of typical lattice-matched materials is AlGaAs/GaAs. Of these materials, AlGaAs has larger indirect transitions then the smaller direct transitions of GaAs.

It has recently been-determined that strained-layer superlattice lattice may be formed from lattce-mismatched materials having a mismatch up to at least 7%. An example of typical materials having a 0.7% mismatch are GaP and $GaAs_{0.2}P_{0.8}$.

This invention recognizes that superlattices made in accordance with the invention can yield a direct bandgap material from either two indirect bandgap materials or one direct and one indirect material if the indirect material has a lower bandgap than the direct gap material. An advantage of the invention is the use of materials having desirable color characteristics which previously could not be used in semiconductor optical devices due to the lack of a direct gap.

Figure 1:
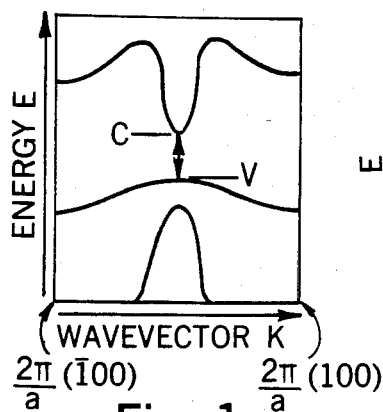
FIG. 1 shows the band states for a typical direct semiconductor material.
Figure 2:
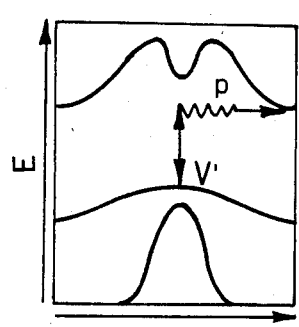
FIG. 2 shows band states for a typical indirect band gap semiconductor material.

FIG. 1 shows a typical direct transition of a direct gap material. FIG. 2 illustrates a phonon assisted transition in an indirect bandgap material. These transitions are well known to those versed in the art of optical properties of semiconductors.

Figure 3:
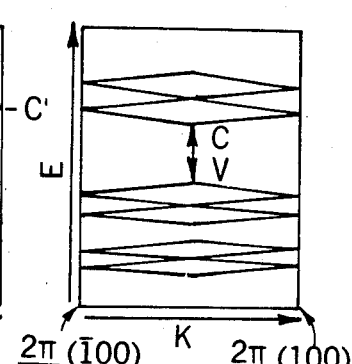
FIG. 3 shows a schematic representation of the energy states of a zone-folded band structure in accordance with this invention.

FIG. 3 shows a schematic representation of a zone-folded band structure of a direct gap superlattice grown from two indirect gap materials. Folding of band structure is a known technique accomplished generally by the formation of a superlattice. Greatly simplified, folding allows C' and V' of an indirect material to be aligned at the same wavevector K. The longer repeat period a' of the superlattice crystal along the growth direction directly results in a shorter repeat period of the k-space unit cell (Brillouin zone) along the growth direction $2\pi/a'$. The new energy bands of the superlattice are "folded" into this smaller Brillouin zone. In accordance with the invention, (100) superlattices must have unit cells with an even number of monolayers of material in order to fold the bulk $(2\pi/a)$ (100) and $(2\pi/a)$ (100) minima onto the superlattice $(2\pi/a)$ (000). If the indirect materials in the superlattice are not lattice-matched, then the superlattice layers must be thin enough (typically less than ~300 Angstroms for mismatches of less than a few %) to produce a high quality strained-layer superlattice. This requirement is crucial for many sets of indirect gap materials such as GaAsP, InGaP and SiGe alloy systems.

An example of a superlattice in accordance with this invention where both materials are lattice matched with a maximum mismatch of approximately 0.1% is GaP/AlGaP. Although each of these materials have indirect transitions, a direct transition occurs in the superlattice formed from alternating layers of these materials.

Several studies have been made of $GaAs/GaAs_{1-x}P_x$ strained-layer superlattices. This second material operates as a direct band gap structure if x is less than 0.45, and abruptly crosses over to an indirect bandgap structure as x increases above 0.45. With x=0.5, the two materials have a mismatch of approximately 1.8%, and strained-layer superlattices can be grown with individual layer thicknesses up to approximately 250 Angstroms, (Å). For x=0.8, the lattice mismatch increases to 2.9% in a strained-layer superlattice.

Figure 4:
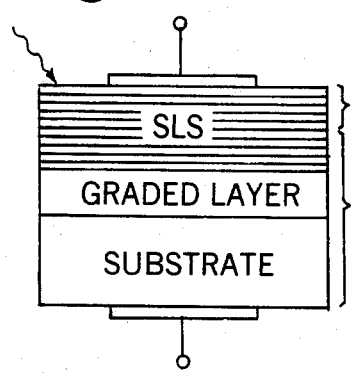
FIGS. 4–6 each show different semi-conductor devices built in accordance with this invention.

The superlattice structure in accordance with the invention may be incorporated into the optical device of FIG. 4 This device includes a GaP substrate having a bulk-graded layer formed of GaAs/GaP onto which the 10,000Å thick superlattice is deposited. Electrical contacts sandwich this structure. Under zero or reverse bias the structure of FIG. 4 functions as an efficient, thin-layered infrared or visible detector. Efficient Schottky diode detectors have been constructed according to this embodiment. For Schottky diode detectors, the p region of the SLS in FIG. 4 is left undoped. The photo-excited carriers are collected by the electric field which results from the Schottky contact. The top contact is an evaporated Au film and the bottom contact is an alloyed In-Sn ohmic contact.

In one experiment, the undoped superlattice structure (SLS) consisted of 30 alternating layers of GaP and $GaAs_{0.2}P_{0.8}$ with individual layer thicknesses equal to 317Å. Quantum efficiency (Q.E.) measurements were made as a function of the wavelength of the incident light and the results were corrected to account for the loss of light due to absorption in the thin (approximately 300Å) Au film which formed the Schottky contact. The results showed Q.E.=13.4% for zone-folded transitions slightly above the bandgap energy ($E_g$+0.2ev) and Q.E.=45.9% for zone-folded transitions higher in energy ($E_g$+0.45ev). These large Q.E. values correspond to absorption lengths of less than 6.6 μm for the lower energy zone-folded transitions and less than 1.5 μm for the higher energy zone-folded transitions. Such absorption lengths are more than a factor of ten smaller than those expected for the corresponding indirect transitions in the bulk GaP and $GaAs_{0.2}P_{0.8}$ materials, and they result from the zone-folding enhanced absorption coefficients in the $GaP/GaAs_{0.2}P_{0.8}$ SLS.

Figure 5:
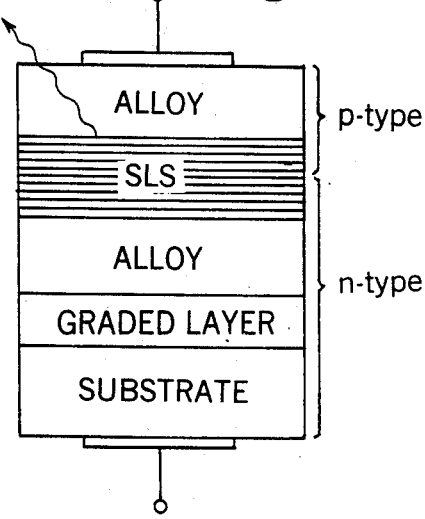
Figure 7:
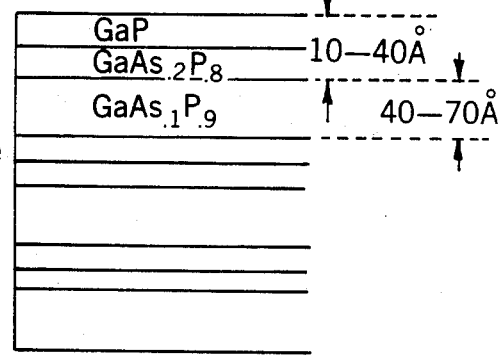
FIG. 7 shows a detail of the superlattice of FIG. 5.

FIG. 5 shows another use of the superlattice where a substrate and graded layer similar to that in FIG. 4 is topped by a $GaAs_{0.1}P_{0.9}$ alloy, the superlattice, another alloy, and the structure is sandwiched between contacts. As shown in FIG. 7, for this embodiment, the superlattice consists of a plurality of three layers: a top layer of GaP and a middle layer of $GaAs_{0.2}P_{0.8}$ having a total thickness of 10–40Å and a lower layer of $GaAs_{0.1}P_{0.9}$ having a thickness of 40–70Å. Approximately 100 sets of these three layers form the 10,000Å superlattice. This device can function as an efficient electroluminescent diode, including a green electroluminescent diode when made from GaP and GaAsP as discussed above. If the edges of the SLS material are cleaved in a known manner and a high current is applied to the device, then it functions as a green laser diode emitting coherent light from the sides of the SLS material.

Figure 6:
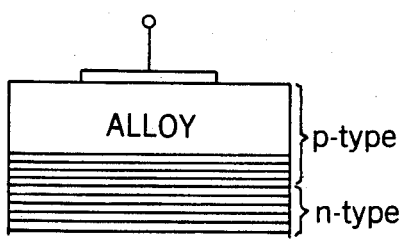

FIG. 6 shows a photovoltaic cell made in accordance with the invention comprising the superlattice topped by an alloy with an electrical contact. This cell is grown on top of other semiconductor material forming a multijunction cell.

The particular embodiments discussed above are cited as exemplary of the uses of this invention. It is contemplated that the invention may involve structures having different arrangements as long as the principle, using a superlattice having direct bandgap structures grown from at least two different materials, at least the material having the smallest band gap having indirect transitions, is followed. A device so constructed will provide a semiconductor optical device having characteristics previously unattainable. It is intended that the scope of the invention be defined by the claims appended hereto.

We claim:

1. A semiconductor device comprising a superlattice having direct transitions between conduction band and valence band states with the same wavector, said superlattice consisting of a plurality of alternating layers of at least two different materials, at least the material having the smallest band gap having indirect transitions between conduction bahd and valence band states with unequal wavevectors, each of said layers being grown along the direction in which indirect conduction minima lie.

2. The semiconductor device of claim 1 wherein said alternating layers are lattice matched with a maximum mismatch of approximately 0.1%.

3. The semiconductor device of claim 2 wherein said alternating layers comprise GaP and AlGaP.

4. The semiconductor device of claim 1 wherein said alternating layers are lattice mismatched within the range extending from 0.1% to 7%.

5. The semiconductor device of claim 4 wherein said alternating layers are formed of GaP and $GaAs_{0.2}P_{0.8}$.

6. The semiconductor device of claim 4 further comprising an electrical contact bonded to one surface of said superlattice; a graded layer formed on the other surface of said superlattice; a substrate bonded to said graded layer, and another electrical contact bonded to said substrate opposite said graded layer; wherein said device comprises a light emitting diode when forward biased across said contacts and a detector under zero or reverse bias.

7. The semiconductor device of claim 4 further comprising $GaAs_{0.1}P_{0.9}$ alloy layers formed on each side of said superlattice, one of said layers having an electrical contact bonded oppposite said superlattice, the other layer having a graded layer, a substrate and an electrical contact successively bonded thereon opposite said superlattice, wherein said device comprises a light emitting device.

8. The semiconductor device of claim 7 wherein said superlattice consist of alternating layers of three materials: GaP, GaAs$_{0.2}$P$_{0.8}$ and GaAs$_{0.1}$P$_{0.9}$.

9. The semiconductor device of claim 4 further comprising an alloy layer formed on each side of, and having the same lattice constant as said superlattice, said layer having an electrical contact bonded opposite said superlattice.

* * * * *